(12) United States Patent
Kobayashi et al.

(10) Patent No.: US 11,683,912 B2
(45) Date of Patent: Jun. 20, 2023

(54) COOLING DEVICE, COOLING SYSTEM, AND COOLING METHOD

(71) Applicant: NEC Corporation, Tokyo (JP)

(72) Inventors: Kenji Kobayashi, Tokyo (JP); Koichi Todoroki, Tokyo (JP); Nirmal Singh Rajput, Tokyo (JP); Yoshinori Miyamoto, Tokyo (JP); Masaki Chiba, Tokyo (JP); Minoru Yoshikawa, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 17/398,208

(22) Filed: Aug. 10, 2021

(65) Prior Publication Data
US 2022/0053670 A1    Feb. 17, 2022

(30) Foreign Application Priority Data

Aug. 14, 2020    (JP) .................... 2020-136969

(51) Int. Cl.
*H05K 7/20*    (2006.01)

(52) U.S. Cl.
CPC ..... *H05K 7/20745* (2013.01); *H05K 7/20145* (2013.01)

(58) Field of Classification Search
CPC ........... H05K 7/20145; H05K 7/20172; H05K 7/20736; H05K 7/2079; H05K 7/1497; H05K 7/20754; H05K 7/20781; H05K 7/20618; H05K 7/20; H05K 7/20136; H05K 7/20609; H05K 7/20818; H05K 7/20181; H05K 7/202; H05K 7/20572; G06F 1/20

USPC ..... 361/695, 696, 679.46, 679.48, 690, 688, 361/692, 694, 679.51, 679.49, 701, 725; 165/104.33, 80.3

See application file for complete search history.

(56) References Cited

U.S. PATENT DOCUMENTS

| | | | | |
|---|---|---|---|---|
| 6,896,612 | B1 * | 5/2005 | Novotny | H05K 7/20781 361/691 |
| 8,203,837 | B2 * | 6/2012 | Zeighami | H05K 7/20745 361/679.48 |
| 8,743,543 | B2 * | 6/2014 | Clidaras | H05K 7/2079 454/118 |
| 8,755,182 | B2 * | 6/2014 | Noteboom | H05K 7/2079 361/679.48 |
| 9,069,534 | B2 * | 6/2015 | Rogers | F24F 7/04 |
| 9,622,387 | B1 * | 4/2017 | Czamara | H05K 7/20536 |
| 9,915,985 | B1 * | 3/2018 | Chen | H05K 7/20145 |
| 10,772,238 | B1 * | 9/2020 | Ross | H05K 7/2079 |
| 2008/0203866 | A1 * | 8/2008 | Chamberlain | F24F 1/0063 312/236 |
| 2018/0124955 | A1 * | 5/2018 | Rogers | H05K 7/20736 |
| 2018/0264932 | A1 * | 9/2018 | Okugawa | B60K 11/04 |

(Continued)

FOREIGN PATENT DOCUMENTS

| | | |
|---|---|---|
| JP | 2010-236833 A | 10/2010 |
| JP | 2019-078429 A | 5/2019 |

*Primary Examiner* — Mandeep S Buttar

(57) ABSTRACT

A cooling device includes: a duct that guides air that has absorbed heat generated inside a cooling target and has been discharged, to the cooling target; a cooler that is provided in the duct and cools the air flowing inside the duct; and an adjusting mechanism that is located on a downstream side of the cooler, adjusts an amount of the air discharged from the duct into a room where the cooling target is installed.

11 Claims, 5 Drawing Sheets

(56) References Cited

U.S. PATENT DOCUMENTS

2020/0080787 A1* 3/2020 Fisher ................... F28D 5/02
2020/0344916 A1* 10/2020 Rancic ................ H05K 7/1497

* cited by examiner

COOLING DEVICE, COOLING SYSTEM, AND COOLING METHOD

This application is based upon and claims the benefit of priority from Japanese patent application No. 2020-136969, filed on Aug. 14, 2020, the disclosure of which is incorporated herein in its entirety by reference.

TECHNICAL FIELD

The present invention relates to a cooling device, a cooling system, and a cooling method.

BACKGROUND ART

As techniques related to cooling a heating element such as a semiconductor used in an electronic device, there are a method of directly cooling the heating element with a refrigerant and the like, and a method of circulating cooling air around the heating element to cool the heating element. Further, in the method of cooling the cooling air, a process of supplying a refrigerant to a heat exchanger and absorbing the heat of the cooling air by the expansion of the refrigerant is performed. When a refrigerant having a small latent heat, which is the heat transfer capacity at the time of phase change, is used as the refrigerant, a turbo compressor having a large flow rate performance characteristic as compared with a positive displacement compressor may be used. In order to prevent the occurrence of surges, this turbo compressor is required to be operated under conditions that are within the pressure and flow rate ranges determined on the basis of the performance characteristics thereof.

On the other hand, the calorific value of a heat generating body such as a semiconductor fluctuates according to the operating conditions (more specifically, the magnitude of the load), and the temperature of the outside air used for cooling also fluctuates with the season and time. Therefore, if the heat energy exchanged by the heat exchanger is small, the flow rate of the refrigerant to be compressed becomes extremely small, and the turbo compressor may have to be operated with a low compression ratio or low yield near the surge region.

Japanese Unexamined Patent Application Publication, First Publication No. 2010-236833 (hereinafter referred to as "Patent Document 1") describes a refrigeration system in which a plurality of heat exchangers are connected. In this refrigeration system, measures are taken to maintain the flow rate of the refrigerant flowing through the turbo compressor and avoid operation in the surge region by operating the turbo compressor in a hot gas bypass state when the overall load is reduced. Further, in the refrigeration system described in Japanese Unexamined Patent Application, First Publication No. 2019-78429 (hereinafter referred to as "Patent Document 2"), measures are taken to adjust the opening degree of the expansion valve during low-load operation of the compressor.

SUMMARY

However, in the cooling system using the turbo heat pump described in Patent Document 1, since the refrigerant is supplied from the common turbo compressor to the plurality of heat exchanger modules, when the load (the amount of heat to be absorbed) of some heat exchanger modules decreases, it is difficult to individually adjust the cooling capacity according to the load. Further, in Patent Document 2, no consideration is given to the reduction of the individual load of the plurality of heat exchangers.

An example object of the present invention is to avoid operation of a turbo compressor in a surge region regardless of a decrease in the amount of exhaust heat as a load.

According to a first example aspect, a cooling device includes: a duct that guides air that has absorbed heat generated inside a cooling target and has been discharged, to the cooling target; a cooler that is provided in the duct and cools the air flowing inside the duct; and an adjusting mechanism that is located on a downstream side of the cooler, adjusts an amount of the air discharged from the duct into a room where the cooling target is installed.

According to a second example aspect, a cooling method includes: guiding air that has absorbed heat generated inside a cooling target installed in an air-conditioned room and has been discharged, to the cooling target; cooling the air guided from an exhaust port toward a suction port; and discharging, on a downstream side of the cooling, a part of the air guided toward the suction port, into the room.

EXAMPLE EMBODIMENT

Figure 1:
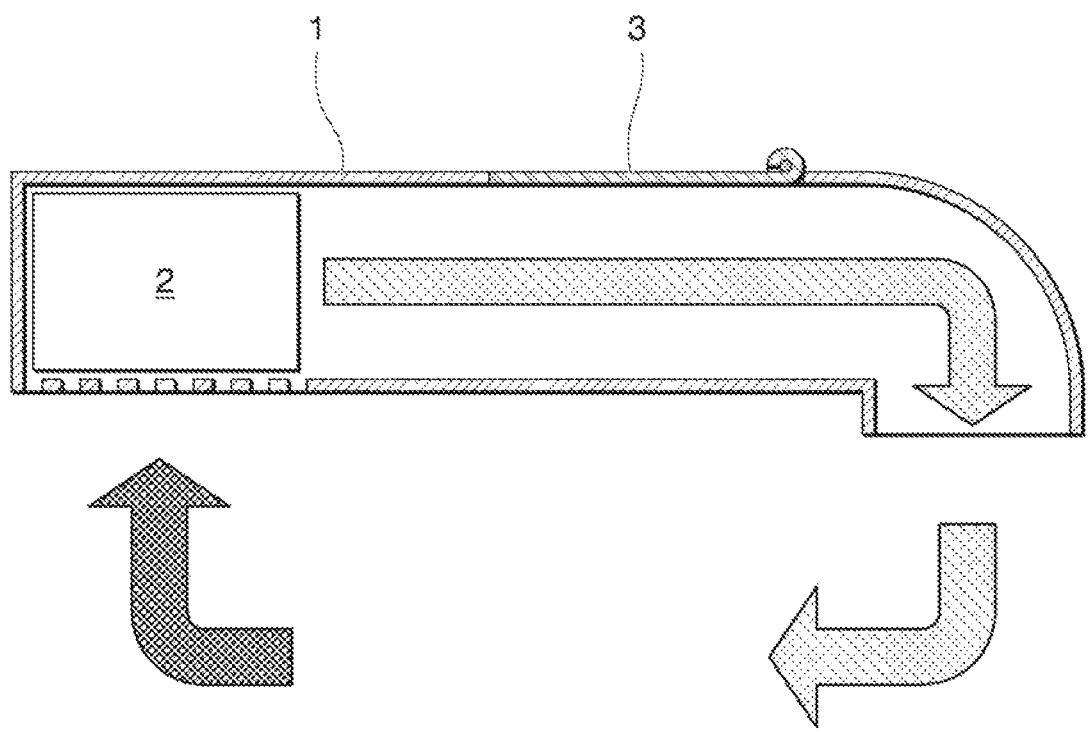
FIG. 1 is a cross-sectional view of a pressure cooling device according to a configuration example of an example embodiment of the present invention.

A configuration example of an example embodiment of the present invention will be described with reference to FIG. 1.

Reference numeral 1 indicates a duct. The duct 1 absorbs heat generated inside a cooling target (not shown in FIG. 1) and guides discharged air to the cooling target. The duct 1 includes a cooler 2 that cools air flowing inside the duct 1, and an adjusting mechanism (damper) 3, on the downstream side of the cooler 2, that adjusts the air to be discharged from the duct 1 to a room where the cooling target is installed.

According to the above configuration, the air cooled by the cooler 2 can be discharged from the duct 1 into the room by the adjusting mechanism 3, and therefore, the amount of the cooling air to be supplied to the cooling target can be reduced as needed.

The cooling method of the configuration includes a step of absorbing the heat generated inside the cooling target installed in the air-conditioned room and guiding discharged air to the cooling target, a step of cooling the air guided from an exhaust port to a suction port, and a step of, on the downstream side of this cooler, discharging a part of the air guided to the suction port into a room.

According to the above configuration, the amount of cooling air supplied to the cooling target can be reduced as necessary by releasing a part of the cooled air into the room.

The first example embodiment of the present invention will be described with reference to FIGS. 2 to 6C. In FIGS. 2 to 6C, the same reference numerals are given to the configurations common to those in FIG. 1, with the descriptions thereof being simplified.

Figure 2:
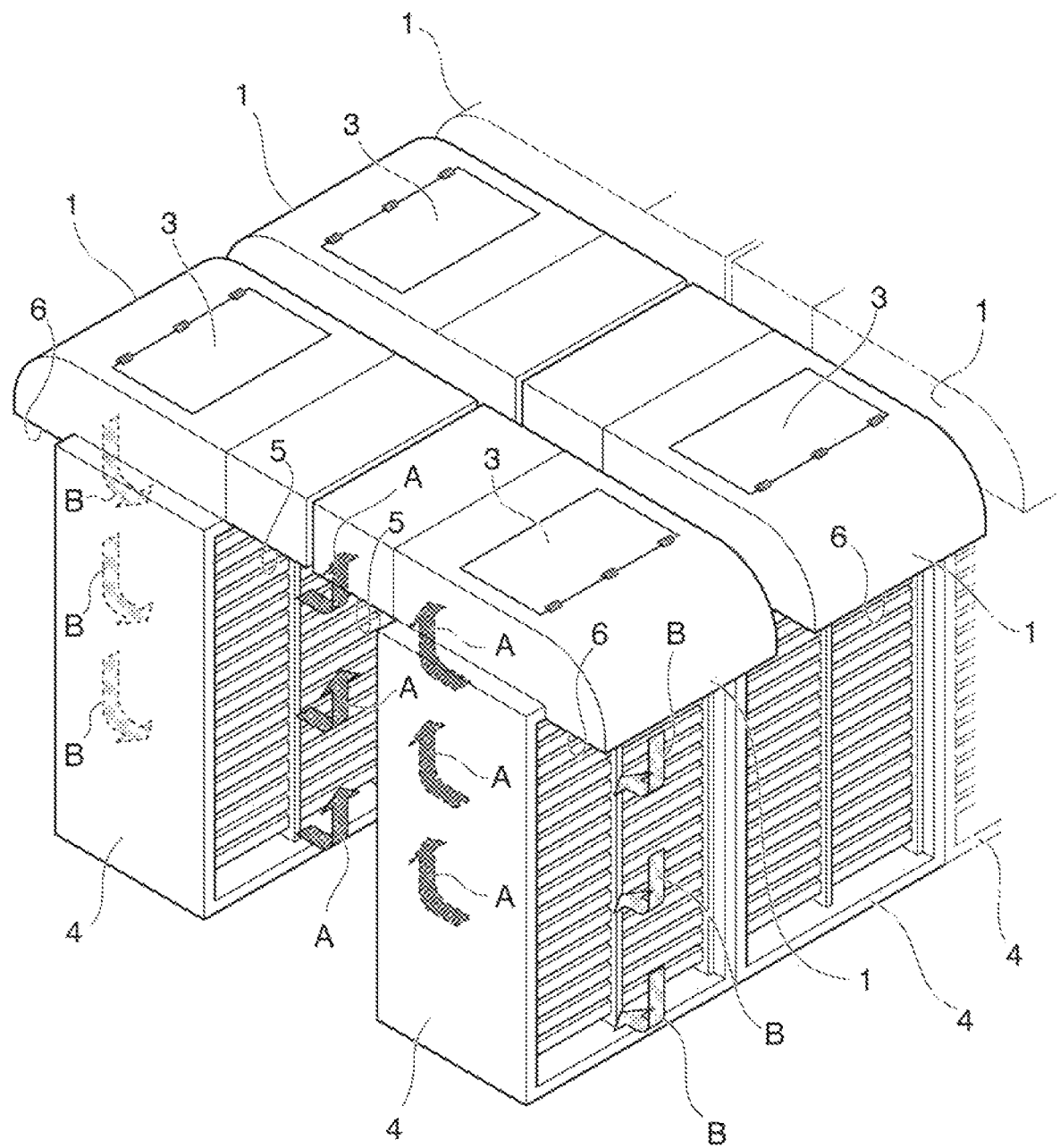
FIG. 2 is a perspective view showing an overall schematic configuration of a first example embodiment of the present invention.

FIG. 2 shows an example of a server room provided with a plurality of cooling devices according to the first example embodiment. In this server room, multiple cooling targets 4 are installed. The cooling targets 4 are, for example, electronic devices such as data servers that are arranged vertically in frame-shaped or box-shaped housings.

The duct 1 located above each of the cooling targets 4 guides air sucked in as shown by the arrow A from a suction port 5 to a discharge port 6, and discharges the air downward as shown by the arrow B. The adjusting mechanism 3 is arranged in the middle of the duct 1, discharges a part of the air heading from the suction port 5 to the discharge port 6 into the server room. The inside of the server room is maintained at a predetermined temperature by an air conditioner (not shown). Generally, the region where the air discharged from the cooling target 4 flows as shown by the arrow A is referred to as a hot aisle, while the region where the air is to be sucked into the cooling target 4 flows as shown by the arrow B is called a cold aisle.

Figure 3:
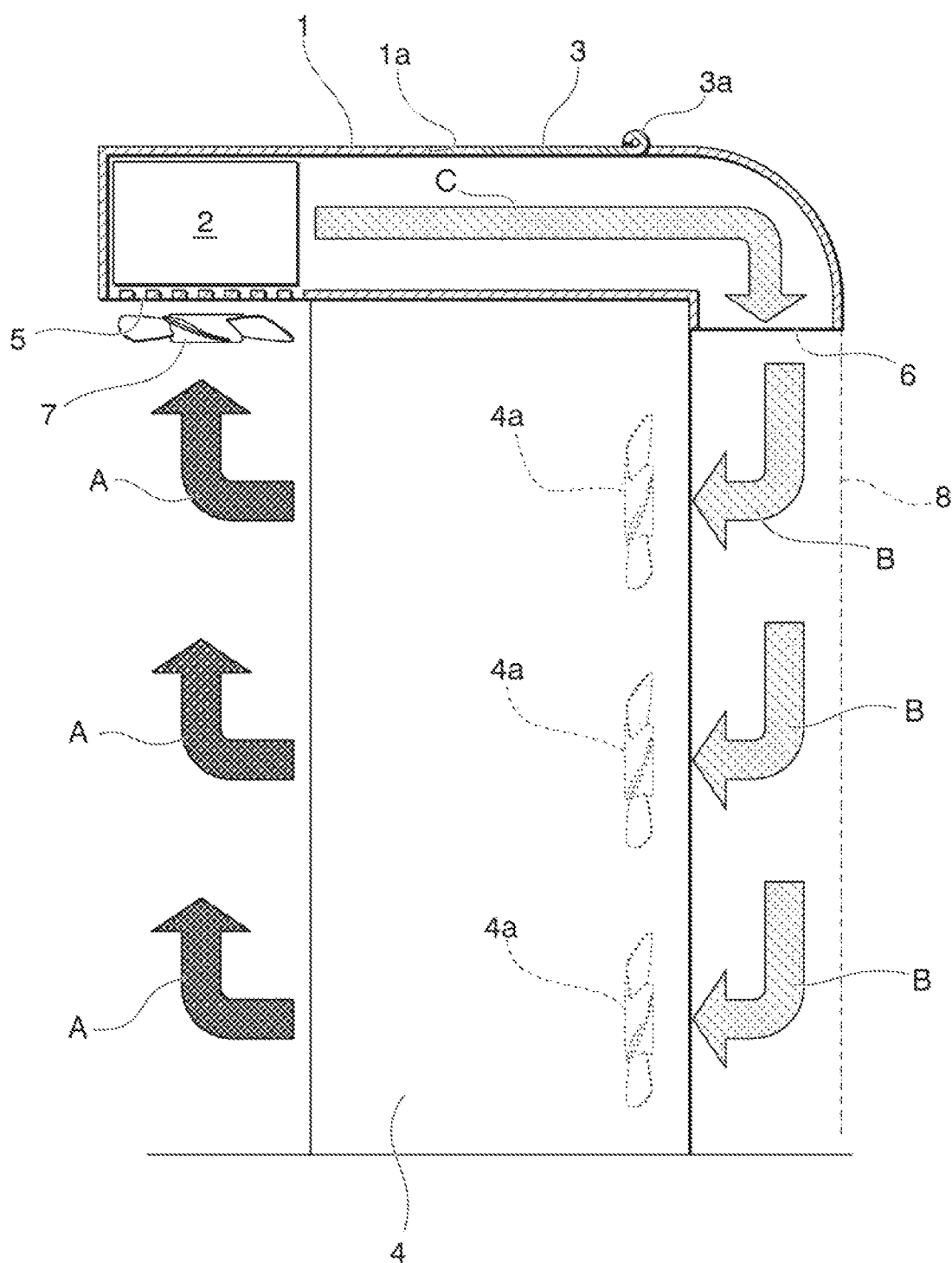
FIG. 3 is a cross-sectional view of a cooling device according to the first example embodiment.
Figure 4:
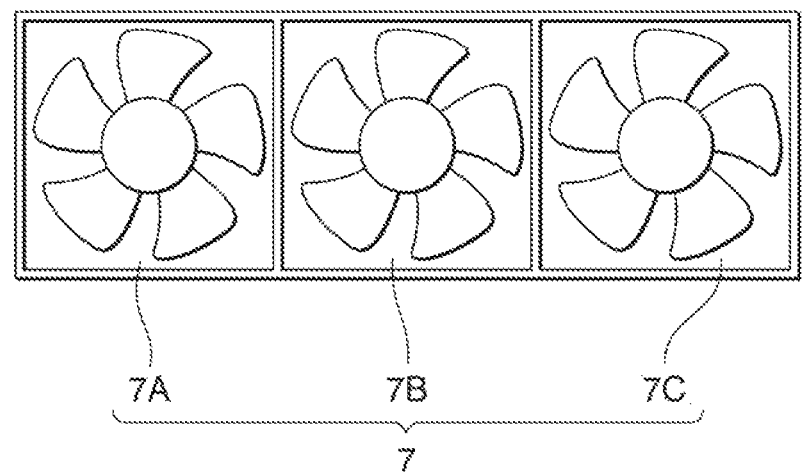
FIG. 4 is a front view of a blower of FIG. 3.

FIG. 3 shows one cross section of the cooling device shown in FIG. 2.

A fan 4a is built into the electronic device constituting the cooling target 4, sucks air in the server room in the left direction of FIG. 3 (direction of the tip of the arrow B) and discharges the air from the left side of the cooling target 4. The air flowing inside the cooling target 4 absorbs heat generated by a heat generating element or the like inside the cooling target 4, is discharged and, by expanding while absorbing heat in the cooling target 4, rises as shown by the arrows A in FIG. 3. The fan 4a is provided for each housing of the electronic device constituting the cooling target 4. The number of fans 4a (and electronic devices) is not limited to the example of FIG. 3.

A fan 7 is provided at the suction port 5 of the duct 1. The fan 7 sucks air that rises in the direction of the arrows A into the duct 1 from the suction port 5. The configuration of the fan 7 corresponds to the cross-sectional shape of the duct 1. For example, the fan 7 has a configuration in which small fans 7A, 7B, and 7C are arranged in a number corresponding to the long side dimension in the cross section of the duct 1. The small fans 7A, 7B, and 7C have a rotational radius corresponding to the short side dimension in the cross section of the duct 1. The number of fans 7 is not limited to the example shown in FIG. 4.

The cooler 2 is provided at a position directly above the suction port 5 of the duct 1. The cooler 2 is a heat exchanger that cools the air sucked in the direction of the arrows A by utilizing, for example, the endothermic reaction accompanying the expansion of the low-pressure refrigerant. The air that has passed through the cooler 2 is guided by the duct 1 and flows in the direction of arrow C to be discharged from the discharge port 6, is sucked by the cooling target 4 in the direction of the arrows B, and once again absorbs the heat therein to be discharged in the direction of the arrows A. The refrigerant (heat medium) is supplied to the cooler 2 from a compressor such as a turbo compressor described later. In the first example embodiment, a pipeline is formed that distributes and supplies the refrigerant to a plurality of the coolers 2 from a main refrigerant supply pipe (not shown) and, after heat exchange, merges and collects the refrigerant that has left the coolers 2 in a main refrigerant return pipe (not shown).

An opening 1a is formed in the upper surface of the duct 1 downstream of the cooler 2. The adjusting mechanism 3 is a plate-shaped damper having a shape corresponding to the opening 1a. This damper 3 is rotatably supported around a central axis 3a heading in the depth direction of the paper surface of FIG. 3. The damper 3 can rotate about the central axis 3a from a position where the opening 1a in FIG. 3 is closed to a position transversing the duct to suppress the flow of air within the duct 1.

The damper 3 rotates by operating an electric motor, a pneumatic cylinder, or the like (not shown) under predetermined conditions to open/close the opening 1a or create an intermediate opening.

Moreover, a sheet-shaped guide plate 8 are provided at a position below the discharge port 6 of the duct 1. The guide plate 8 suppresses diffusion of the air discharged from the discharge port 6 into the server room and guides the air downward (in the direction of the arrows B). The guide plate 8 is made of a curtain-shaped or blind-shaped easily deformable material that can be easily opened and closed in consideration of ease of access to the electronic device serving as the cooling target.

Figure 5:
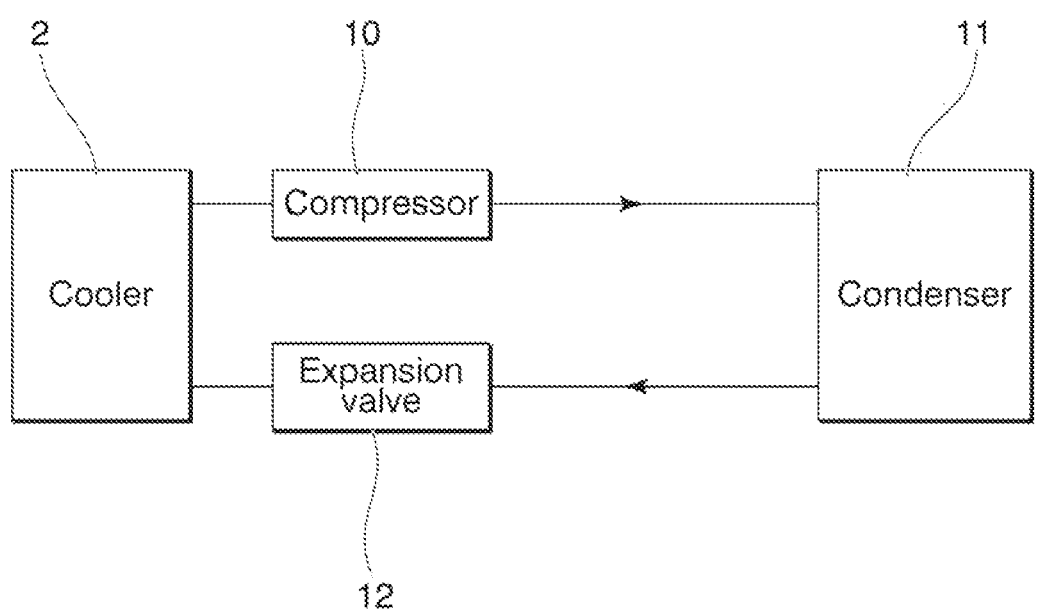
FIG. 5 is a piping diagram of a refrigerant circulation system.

The outline of the cooling system for supplying the refrigerant to the cooler 2 will be described with reference to FIG. 5.

The refrigerant that has been heated and compressed in the compressor 10 is supplied to the condenser 11. The condenser 11 condenses the refrigerant by cooling the refrigerant compressed and discharged by the compressor 10. The expansion valve 12 is composed of, for example, a needle valve, a ball valve or the like. By adjusting the degree of opening of the expansion valve 12, the refrigerant from which heat has been dissipated by heat exchange in the condenser 11 is depressurized by undergoing a predetermined pressure loss and is supplied to the cooler 2 in a low-temperature gas-liquid mixed phase state. In FIG. 5, one cooler 2 is displayed, but in the first example embodiment, a plurality of the coolers 2 are connected to the compressor 10 in parallel with the cooler 2 to receive the supply of the refrigerant.

Figure 6A:
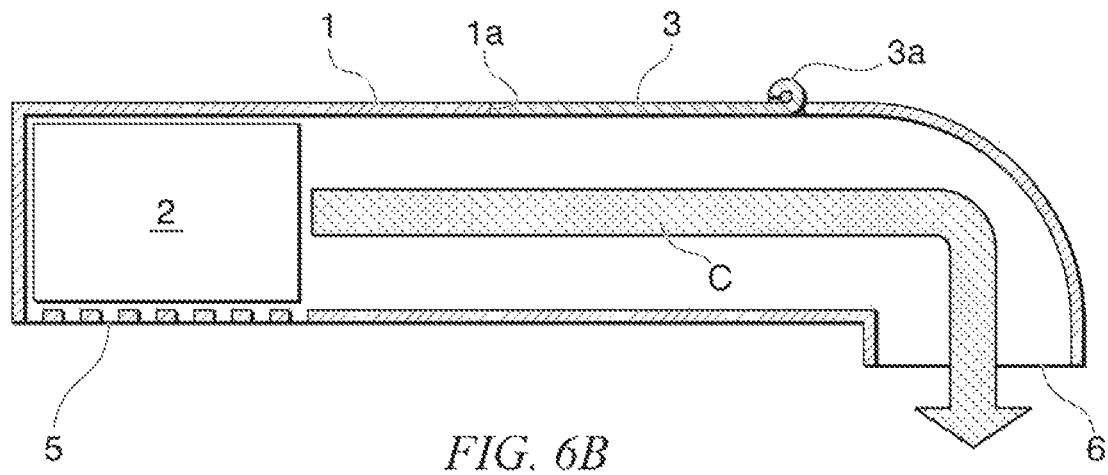
FIG. 6A is an explanatory diagram of a switching state of the first example embodiment.
Figure 6B:
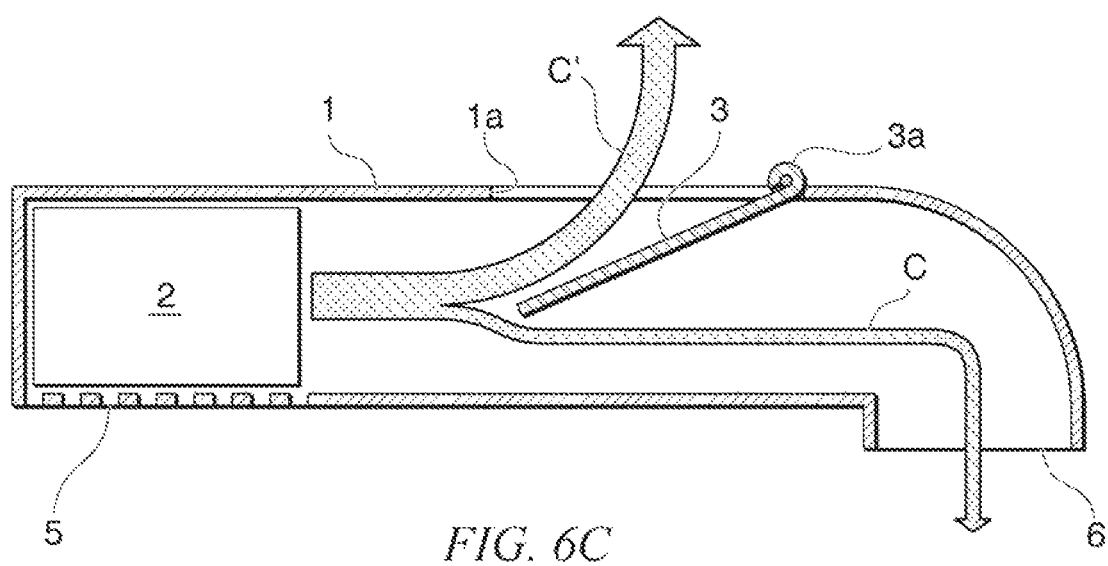
FIG. 6B is an explanatory diagram of a switching state of the first example embodiment.
Figure 6C:
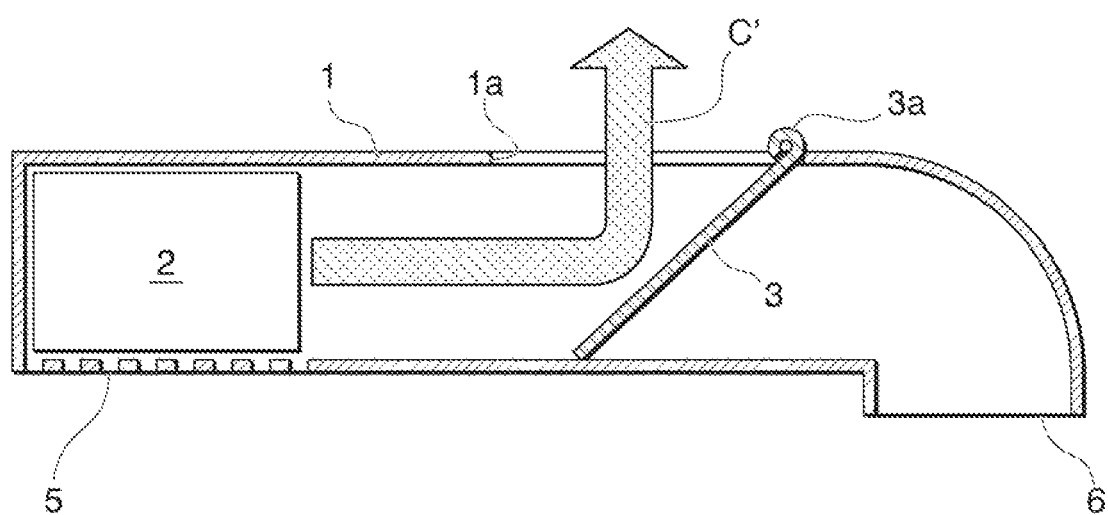
FIG. 6C is an explanatory diagram of a switching state of the first example embodiment.

With reference to FIGS. 6A to 6C, the cooling method executed in the cooling device of the first example embodiment and the operation thereof will be described.

FIG. 6A: When the amount of heat generated by the cooling target 4 is high or the temperature inside the server room is high, the damper 3 rises to close the opening 1a. In a state where the damper 3 is raised and the duct 1 is fully opened (the opening 1a is fully closed), the air sucked from the suction port 5 is cooled by the heat absorbing action (endothermic reaction) accompanying the expansion of the refrigerant in the cooler 2, and the entire amount of the air flowing through the duct 1 is discharged from the discharge port 6 to the cooling target 4.

FIG. 6B: When either one or both of the calorific value of the cooling target 4 and the temperature in the server room are moderate, the damper 3 is lowered to be arranged at a position substantially corresponding to the center of the duct 1. A part of the air sucked in from the suction port 5 and cooled by the cooler 2 is guided in the direction of the arrow C and discharged from the opening (opening part) 1a into the server room. The other part of the air is guided in the duct 1 in the direction of arrow C, discharged from the discharge port 6, and sucked into the cooling target 4.

FIG. 6C: When either one or both of the calorific value of the cooling target 4 and the temperature in the server room are low, the damper 3 is lowered to the bottom of the duct 1 to fully close the duct 1. In this state, the entire amount of the air sucked in from the suction port 5 and cooled by the cooler 2 is guided in the direction of the arrow C' and discharged from the opening 1a into the server room. In this state, the cooling target 4 sucks in air from the cold aisle in the server room and releases the air into the hot aisle in the server room. That is, the cooling target 4 is cooled by the air inside the server room.

In the operating state of FIGS. 6B and 6C, since the entire amount of air discharged from the cooling target 4 and sucked into the duct 1 undergoes heat exchange by the cooler 2 under nearly the same conditions as in the case of FIG. 6A, the turbo compressor that supplies the refrigerant to the cooler 2 can be operated in a normal operating region close to the case of a high calorific value and high room temperature (an operating region that does not lead to the conditions of a low compression ratio and low refrigerant flow rate that would enter the surge region).

Further, since the temperature of the server room can be lowered by the cooling air discharged from the opening 1a into the server room, it is possible to reduce the load of the air-conditioning compressor in the server room, which is generally provided separately from the compressor of the cooler 2. That is, the cooling air discharged from the opening 1a after being sucked into the duct 1 and cooled by the cooler 2 can be effectively used for cooling the server room.

The electric motor that drives the damper 3 is controlled by the result of judging the cooling status of the cooling target 4 by, for example, a control unit that controls the air conditioning of the server room or a control unit that manages the intake/exhaust temperature of the electronic device that is the cooling target.

According to an example embodiment of the present invention, it is possible to avoid operation of a turbo compressor in the surge region.

The present invention may be used in a cooling device and a cooling method.

While preferred example embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A cooling device comprising:
a duct that guides air that has absorbed heat generated inside a cooling target and has been discharged, to the cooling target;
a cooler that is provided in the duct and cools the air flowing inside the duct; and
an adjusting mechanism that is located on a downstream side of the cooler, adjusts an amount of the air discharged from the duct into a room where the cooling target is installed,
wherein the adjusting mechanism prevents the air from flowing to outside of the duct through an opening by closing the opening, the opening being provided in an upper surface of the duct, and
the adjusting mechanism guides at least a part of the air to the outside of the duct through the opening by opening the opening and preventing flow of the air inside the duct.

2. The cooling device according to claim 1,
wherein the duct is provided above the cooling target, and the duct receives the air that is discharged from one side of the cooling target and heads-upward, and guides the air to another side of the cooling target.

3. The cooling device according to claim 2, wherein the duct discharges the air downward on said another side.

4. The cooling device according to claim 1, wherein the duct, the cooler, and the adjusting mechanism are provided for each of a plurality of cooling targets including the cooling target.

5. The cooling device according to claim 1, wherein the cooling target is an electronic device and transmits heat to the air flowing from one side in a horizontal direction to another side in the horizontal direction.

6. An air cooling system comprising:
the cooling device according to claim 1; and
the cooling target; and
wherein the duct sucks in the air from a side where the cooling target discharges the air, and supplies the air to a side where the cooling target sucks in the air.

7. The air cooling system according to claim 6, wherein the cooling target includes a plurality of cooling targets arranged in a same air-conditioned room.

8. A cooling method comprising:
guiding, by a duct, air that has absorbed heat generated inside a cooling target installed in an air-conditioned room and has been discharged, to the cooling target;
cooling, by a cooler that is provided in the duct, the air flowing inside the duct; and
adjusting, by an adjusting mechanism that is located on a downstream side of the cooler, an amount of the air discharged from the duct into the room,
wherein adjusting the amount of the air comprises:
preventing the air from flowing to outside of the duct through an opening by closing the opening, the opening being provided in an upper surface of the duct; and
guiding at least a part of the air to the outside of the duct through the opening by opening the opening and preventing flow of the air inside the duct.

9. The cooling device according to claim 1, wherein the adjusting mechanism adjusts the amount of the air based on an amount of the heat and a temperature inside the room.

10. The cooling device according to claim 1,
wherein the duct includes a first duct and a second duct, the cooler includes a first cooler and a second cooler, and the adjusting mechanism includes a first adjusting mechanism and a second adjusting mechanism,
the first cooler is provided in the first duct, and the first adjusting mechanism is located on a downstream side of the first cooler, and
the second cooler is provided in the second duct, and the second adjusting mechanism is located on a downstream side of the second cooler.

11. The cooling device according to claim 1, wherein the adjusting mechanism opens or closes the opening depending on an amount of the heat.

* * * * *